US010766785B2

(12) United States Patent
Mimura et al.

(10) Patent No.: US 10,766,785 B2
(45) Date of Patent: Sep. 8, 2020

(54) METHOD OF ARRANGING NANOCRYSTALS, METHOD OF PRODUCING NANOCRYSTAL STRUCTURE, NANOCRYSTAL STRUCTURE FORMATION SUBSTRATE, AND METHOD OF MANUFACTURING NANOCRYSTAL STRUCTURE FORMATION SUBSTRATE

(71) Applicant: NATIONAL INSTITUTE OF ADVANCED INDUSTRIAL SCIENCE AND TECHNOLOGY, Tokyo (JP)

(72) Inventors: Ken-ichi Mimura, Owariasahi (JP); Kazumi Kato, Tokyo (JP)

(73) Assignee: NATIONAL INSTITUTE OF ADVANCED INDUSTRIAL SCIENCE AND TECHNOLOGY (JP)

( * ) Notice: Subject to any disclaimer, the term of this patent is extended or adjusted under 35 U.S.C. 154(b) by 18 days.

(21) Appl. No.: 15/518,957

(22) PCT Filed: Oct. 7, 2015

(86) PCT No.: PCT/JP2015/078489
§ 371 (c)(1),
(2) Date: Apr. 13, 2017

(87) PCT Pub. No.: WO2016/060042
PCT Pub. Date: Apr. 21, 2016

(65) Prior Publication Data
US 2017/0225964 A1 Aug. 10, 2017

(30) Foreign Application Priority Data
Oct. 17, 2014 (JP) .................................. 2014-212666

(51) Int. Cl.
*C01G 23/00* (2006.01)
*C01F 11/00* (2006.01)
(Continued)

(52) U.S. Cl.
CPC .............. *C01G 23/003* (2013.01); *B82B 1/00* (2013.01); *C01F 11/00* (2013.01); *C01G 23/006* (2013.01);
(Continued)

(58) Field of Classification Search
CPC ...... C01G 23/003; C01G 23/006; B82B 1/00; B82B 7/10; B82B 29/32; B82B 29/60; C01F 11/00
See application file for complete search history.

(56) References Cited

U.S. PATENT DOCUMENTS

2006/0159849 A1* 7/2006 Morita ................... B82Y 10/00
427/258

FOREIGN PATENT DOCUMENTS

CN  102992392 A  3/2013
CN  103319736 A  9/2013
(Continued)

OTHER PUBLICATIONS

Search Report dated May 28, 2018 issued in corresponding European Patent Application No. 15851305.1.
(Continued)

*Primary Examiner* — James A Fiorito
(74) *Attorney, Agent, or Firm* — Ostrolenk Faber LLP

(57) ABSTRACT

A method of arranging nanocrystals is provided, which includes a first process of putting barium titanate nanocrystals and/or strontium titanate nanocrystals, and a nonpolar solvent into a container, a second process of collecting a supernatant liquid including the barium titanate nanocrystals and/or the strontium titanate nanocrystals from the con-
(Continued)

tainer, and a third process of immersing a substrate having an uneven structure into the supernatant liquid, and pulling up the substrate so as to coat the surface of the uneven structure with the supernatant liquid by using a capillary phenomenon, and to arrange the nanocrystals on the uneven structure.

9 Claims, 6 Drawing Sheets

(51) Int. Cl.
    *C30B 29/32*     (2006.01)
    *C30B 29/60*     (2006.01)
    *C30B 7/10*     (2006.01)
    *B82B 1/00*     (2006.01)
    *B82Y 40/00*     (2011.01)

(52) U.S. Cl.
    CPC ............... *C30B 7/10* (2013.01); *C30B 29/32* (2013.01); *C30B 29/60* (2013.01); *B82Y 40/00* (2013.01); *C01P 2004/03* (2013.01); *C01P 2004/04* (2013.01)

(56) References Cited

FOREIGN PATENT DOCUMENTS

| | | |
|---|---|---|
| CN | 103880014 A | 6/2014 |
| JP | 2003-107753 A | 4/2003 |
| JP | 2004-511828 A | 4/2004 |
| JP | 2008-230959 A | 10/2008 |
| JP | 2012-188335 A | 10/2012 |
| KR | 10-2008-0055582 A | 6/2008 |
| WO | WO 02/33461 A2 | 4/2002 |
| WO | WO 2010/079843 A1 | 7/2010 |

OTHER PUBLICATIONS

Office Action dated May 17, 2018 issued in corresponding Korean Patent Application No. 10-2017-7012998 with English translation.

Ken-ichi Mimura et al. "Characterization of Dielectric Nanocubes Ordered Structures Fabricated by Solution Self-Assembly Process", Japanese Journal of Applied Physics, vol. 50, No. 9 (2011) pp. 09NC09 1-6.

K. Mimura et al. "Piezoresponse properties of orderly assemblies of $BaTiO_3$ and $SrTiO_3$ nanocube single crystals", Applied Physics Letters, vol. 101, No. 1 (2012) pp. 12901-1 to 12901-4.

Xun Wang et al. "A general strategy for nanocrystal synthesis", Nature, vol. 437, No. 7055 (2005) pp. 121-124.

Japanese Office Action, dated Jun. 12, 2018, issued in corresponding Japanese Patent Application No. 2016-554052. English translation. Total 10 pages.

Mimura, K et al. "Fabrication and Characterization of Barium Titanate Nanocube Ordered Assemblies on Substrate With Pattern" *Program of the 33rd Electronics Division Meeting of the Ceramic Society of Japan.* Oct. 24, 2013. pp. 44 to 45. Includes English Abstract on top of first page.

International Search Report dated Dec. 22, 2015 in corresponding PCT International Application No. PCT/JP2015/078489.

Written Opinion dated Dec. 22, 2015 in corresponding PCT International Application No. PCT/JP2015/078489.

T. Tsurumi et al.,"Anomalous dielectric and optical properties in perovskite-type artificial superlattices," Sci. Technol. Adv. Mat., 5, 425-429 (2004).

S. Adireddy et al., "Solution-Based Growth of Monodisperse Cube-Like $BaTiO_3$ Colloidal Nanocrystals," Chem. Mater., 22, 1946-1948 (2010).

K. Fujinami et al., "Sub-10 nm strontium titanate nanocubes highly dispersed in non-polar organic solvents," Nanoscale, 2, 2080-2083 (2010).

Ken-ichi Mimura, et al., "Fabrication and Characterization of Barium Titanate Nanocube Ordered Assemblies on Micro-patterned Substrates," Journal of the Ceramic Society of Japan 123 [7], 2015, pp. 579-582.

Ken-ichi Mimura, et al., "Dielectric Properties of Micropatterns Consisting of Barium Titanate Single-crystalline Nanocubes," Japanese Journal of Applied Physics 54, 10S, 2015, pp. 10NA11-10NA11-6.

Ken-ichi Mimura, et al., "Processing of Dielectric Nanocube 3D-assemblies and Their High Electrical Properties for Next-generation Devices," Journal of the Ceramic Society of Japan 124 [9], 2016, pp. 848-854.

\* cited by examiner

METHOD OF ARRANGING NANOCRYSTALS, METHOD OF PRODUCING NANOCRYSTAL STRUCTURE, NANOCRYSTAL STRUCTURE FORMATION SUBSTRATE, AND METHOD OF MANUFACTURING NANOCRYSTAL STRUCTURE FORMATION SUBSTRATE

CROSS-REFERENCE TO RELATED APPLICATIONS

The present application is a 35 U.S.C. §§ 371 national phase conversion of PCT/JP2015/078489, filed Oct. 7, 2015, which claims priority to Japanese Patent Application No. 2014-212666, filed Oct. 17, 2014, the contents of which are incorporated herein by reference. The PCT International Application was published in the Japanese language.

TECHNICAL FIELD

The present invention relates to a method of arranging nanocrystals, a method of producing a nanocrystal structure, a nanocrystal structure formation substrate, and a method of manufacturing a nanocrystal structure formation substrate.

BACKGROUND ART

A nanocrystal shows distinctive physical properties caused by the size, and applications as a new material are expected. In particular, it is reported that significantly large dielectric characteristics are shown in a BT/ST artificial superlattice thin film having a hetero interface between barium titanate ($BaTiO_3$, BT), which is a ferroelectric substance, and strontium titanate ($SrTiO_3$, ST) which is a paraelectric substance (NPL 1). If three-dimensionally bottoming-up of the hetero interface is allowed, further gigantic properties can be expected.

CITATION LIST

Non-Patent Literature

[NPL 1] T. Tsurumi et al., Sci. Technol. Adv. Mat., 5, 425-429 (2004).
[NPL 2] S. Adireddy, C. Lin, B. Cao, W. Zhou, and G. Caruntu, Chem. Mater., 22, 1946-1948 (2010)
[NPL 3] K. Fujinami, K. Katagiri, J. Kamiya, T. Hamanaka, and K. Koumoto, Nanoscale, 2, 2080-2083 (2010)

SUMMARY OF INVENTION

Technical Problem

In NPL 2, a method of synthesizing barium titanate nanocrystals is reported. In NPL 3, a method of synthesizing strontium titanate nanocrystals is reported.

When nanocrystals including nanocubes are applied in an electronic device and the like, it is desirable that a technology of arranging nanocrystals on a substrate be established.

Considering the above circumstances, an object of the present invention is to provide a new method of arranging nanocrystals in which nanocrystals are arranged on a substrate, a new method of producing a nanocrystal structure in which a structure formed by nanocrystals is produced on a substrate, a nanocrystal structure formation substrate in which a substrate is coated with a structure formed by nanocrystals, and a method of manufacturing a nanocrystal structure formation substrate.

Solution to Problem

The inventors performed close examination for achieving the above object. As a result, the inventors found that a substrate having an uneven structure was immersed and pulled up in a supernatant liquid obtained by performing centrifugation on a solution in which barium titanate nanocrystals, strontium titanate nanocrystals, or a set of barium titanate nanocrystals and strontium titanate nanocrystals was dispersed in a nonpolar solvent, and thus the nanocrystals were arranged by a capillary phenomenon occurring along the uneven structure.

To achieve the above object, the present invention provides the following means.

(1) According to one aspect of the present invention, a method of arranging nanocrystals is provided, which includes a first process of putting barium titanate nanocrystals and/or strontium titanate nanocrystals, and a nonpolar solvent into a container, a second process of collecting a supernatant liquid including the barium titanate nanocrystals and/or the strontium titanate nanocrystals from the container, and a third process of immersing a substrate having an uneven structure into the supernatant liquid and pulling the substrate up, so as to coat a surface of the uneven structure with the supernatant liquid by using a capillary phenomenon, and to arrange the nanocrystals on the uneven structure.

(2) In the method of arranging nanocrystals in (1), in the second process, the supernatant liquid may be obtained by performing centrifugation on the container.

(3) In the method of arranging nanocrystals in (2), in a case where the barium titanate nanocrystals and/or strontium titanate nanocrystals are obtained in a manner in which synthesis is performed in a solution, and then the solution is subjected to centrifugation in a first rotation condition and precipitates are collected, a rotation condition when centrifugation is performed on the container in the second process may be different from the first rotation condition.

(4) In the method of arranging nanocrystals in any one of (1) to (3), organic carboxylic acid may adhere to surfaces of the barium titanate nanocrystals and/or the strontium titanate nanocrystals before being put into the container.

(5) In the method of arranging nanocrystals in any one of (1) to (4), the nonpolar solvent may be mesitylene (1,3,5-trimethylbenzene).

(6) In the method of arranging nanocrystals in any one of (1) to (5), the rate of pulling the substrate up may be 10 nm/sec to 100 nm/sec.

(7) In the method of arranging nanocrystals in any one of (1) to (6), the uneven structure may have recessed portions of a straight shape, a curved shape, and/or a dot shape, and the shortest width and a depth of the recessed portions may be 0.01 μm to 1 mm.

(8) In the method of arranging nanocrystals in any one of (1) to (7), the uneven structure may be formed by a polymer film which is not dissolved in the nonpolar solvent.

(9) The third process may be further performed once or be repeated plural times on a substrate having the uneven structure in which nanocrystals are arranged by the method of arranging nanocrystals in any one of (1) to (8).

(10) According to another aspect of the present invention, a method of producing a nanocrystal structure is provided, which includes a first process of putting barium titanate nanocrystals and/or strontium titanate nanocrystals, and a nonpolar solvent into a container, a second process of collecting a supernatant liquid including the barium titanate nanocrystals and/or the strontium titanate nanocrystals from the container, and a third process of immersing a substrate having an uneven structure into the supernatant liquid and pulling the substrate up, so as to coat a surface of the uneven structure with the supernatant liquid by using a capillary phenomenon, and to produce a structure formed from the nanocrystals on the uneven structure.

(11) In the method of producing a nanocrystal structure in (10), in the second process, the supernatant liquid may be obtained by performing centrifugation on the container.

(12) The third process may be performed once or be repeated plural times on the substrate having a nanocrystal film which is produced by the method of producing a nanocrystal structure in (10) or (11).

(13) A substrate having the uneven structure in which a nanocrystal structure is formed by the method of producing a nanocrystal structure in any one of (10) to (12) may be immersed into a polar solvent so as to dissolve the uneven structure.

(14) According to still another aspect of the present invention, a method of manufacturing a nanocrystal structure formation substrate is provided, which includes producing a nanocrystal structure on a substrate by the method of producing a nanocrystal structure in any one of (10) to (13).

(15) In the method of manufacturing a nanocrystal structure formation substrate according to (14), the substrate may be selected from the group consisting of FTO, ITO, glass, silicon, metal, ceramics, polymer, paper, rubber, and a low heat-resistant base material.

(16) According to still another aspect of the present invention, a nanocrystal structure formation substrate is provided, which includes a substrate and a nanocrystal structure in which barium titanate nanocrystals and/or strontium titanate nanocrystals are arranged on the substrate.

In the present invention, "a nanocrystal" refers to a hexahedral crystal and includes an incomplete hexahedral crystal which has beveled vertices of a hexahedron and is generated simultaneously in a process of synthesizing or producing a nanocube, in addition to a so-called nanocube. The incomplete hexahedral crystal which has beveled vertices of a hexahedron is an intermediate of a hexahedral crystal. The size thereof is not limited if the size is a nanometer size which allows barium titanate and/or strontium titanate to have a hexahedral shape. For example, the size thereof can be about 1 to 100 nm.

"A nanocrystal structure" includes a structure having a void provided at a portion thereof, in addition to a structure which is densely formed without a void. The nanocrystal structure may be a nanocrystal film obtained by joining structures.

Advantageous Effects of Invention

The method of arranging nanocrystals according to one aspect of the present invention employs a configuration in which a first process of putting barium titanate nanocrystals and/or strontium titanate nanocrystals, and a nonpolar solvent into a container, a second process of collecting a supernatant liquid including the barium titanate nanocrystals and/or the strontium titanate nanocrystals from the container, and a third process of immersing a substrate having an uneven structure into the supernatant liquid and pulling the substrate up, so as to coat a surface of the uneven structure with the supernatant liquid by using a capillary phenomenon, and arrange the nanocrystals on the uneven structure are performed. Thus, it is possible to two-dimensionally arrange nanocrystals (barium titanate nanocrystals, strontium titanate nanocrystals, or a set of barium titanate nanocrystals and strontium titanate nanocrystals) on the uneven structure by using the supernatant liquid which is obtained by performing centrifugation of a solution in a state where the nanocrystals are dispersed by the nonpolar solvent without being aggregated. That is, barium titanate nanocrystals, strontium titanate nanocrystals, or a set of barium titanate nanocrystals and strontium titanate nanocrystals can be two-dimensionally arranged without being randomly aggregated. The reason is as follows. If a crystal face unique to a crystal is exposed to the surface when nanocrystals are gathered, arranging is performed to cause crystal faces to match each other. Thus, it is most stable because nanocrystals are two-dimensionally arranged in the surface of a substrate. In a case including barium titanate nanocrystals and strontium titanate nanocrystals, nanocrystals can be arranged to be mixed with each other without a situation occurring in which each type of nanocrystals forms an individual arrangement region. It is possible to produce a nanocrystal structure in which nanocrystals are two-dimensionally arranged along the uneven structure and bottom-up is three-dimensionally performed.

The method of arranging nanocrystals according to one aspect of the present invention employs the third process of immersing a substrate having an uneven structure and pulling the substrate up, so as to coat the surface of the uneven structure with a supernatant liquid by using a capillary phenomenon, and to arrange nanocrystals on the uneven structure. The substrate has the uneven structure, and thus it is possible to selectively arrange nanocrystals at a recessed portion thereof or to selectively fill the recessed portion with nanocrystals, and to provide anisotropy for a drying rate of a solvent. Thus, it is possible to suppress an occurrence of a crack and the like at a time of drying and contraction.

In the method of arranging nanocrystals according to one aspect of the present invention, in the second process, if the supernatant liquid is obtained by performing centrifugation on the container, it is possible to arrange nanocrystals so as to have a more uniform size.

In the method of arranging nanocrystals according to one aspect of the present invention, in a case of using a liquid obtained in a manner in which barium titanate nanocrystals and/or strontium titanate nanocrystals are synthesized in a solution, and then the solution is subjected to centrifugation in the first rotation condition and the obtained precipitate is collected, it is preferable that the rotation condition (second rotation condition) of centrifugation of the container in the second process be different from the first rotation condition. With such a configuration, only nanocrystals which are precipitated in the first rotation condition and are not precipitated in the second rotation condition remain in the supernatant liquid. Thus, the size of nanocrystals to be arranged can be more uniform, and arrangement is easily performed. If the size of nanocrystals to be arranged is uniform, it is possible to prevent an occurrence of arrangement defects such as random arrangement or voids, which are caused by a difference of a size between nanocrystals, to a certain extent. Here, as the rotation condition, a rotation speed, a rotation period, and the like are provided. The first rotation condition and the second rotation condition may have different rotation speeds or different rotation periods.

In the method of arranging nanocrystals in the aspect of the present invention, a substance obtained by adhering organic carboxylic acid to the surfaces of barium titanate nanocrystals and/or strontium titanate nanocrystals before the nanocrystals are input into the container is preferably used. If organic carboxylic acid adheres, a nanocrystal (that is, a nanocube) having a complete hexahedral shape can be easily formed, and a supernatant liquid in which many complete hexahedral nanocrystals are present can be used. As a result, the nanocrystals are easily arranged on a substrate. At the beginning of growth, the barium titanate nanocrystals or the strontium titanate nanocrystals have a regular octahedron surrounded by (111) planes which have the smallest surface energy. A state of a shape in which six (100) planes as the maximum, in which beveled vertices of an octahedron are provided along with the (111) plane, occurs at an intermediate stage for forming an octahedral nanocrystal. At this time, the (100) plane has surface energy larger than that of the (111) plane. Thus, molecules of organic carboxylic acid such as oleic acid adhere to the (100) plane easier than the (111) plane. As a result, when barium titanate nanocrystals or strontium titanate nanocrystals are synthesized, crystal growth proceeds in a state where organic carboxylic acid such as oleic acid adheres to the (100) plane. Proceeding of crystal growth in the (100) plane is difficult, but crystal growth in the (111) plane proceeds without being disturbed by organic carboxylic acid molecules. Thus, growth in all of eight (111) planes proceeds, and vertices are formed. Thus, a complete hexahedral nanocrystal being a hexahedron as a whole is easily formed. Regarding a nanocrystal in which a unique crystal face is exposed so as to fix the shape thereof to be a certain shape, nanocrystal is arranged by a relative relationship of surface energy of the crystal face, so as to cause the surface energy to be the smallest. Thus, a structure can be assembled (bottom-up) by using the shape of the nanocrystal.

In the method of arranging nanocrystals according to one aspect of the present invention, if mesitylene (1,3,5-trimethylbenzene) is used as the nonpolar solvent, it is possible to appropriately control an evaporation condition of a solvent in drying. As a result, it is possible to arrange nanocrystals more regularly.

In the method of arranging nanocrystals according to one aspect of the present invention, if a rate of pulling the substrate up is set to be 10 nm/sec to 100 nm/sec, it is possible to arrange nanocrystals more continuously, and to arrange nanocrystals with high efficiency.

In the method of arranging nanocrystals according to one aspect of the present invention, if the uneven structure has recessed portions of a straight shape, a curved shape, and/or a dot shape, and the shortest width and a depth of the recessed portions are set to be 0.01 μm to 1 mm, it is possible to arrange nanocrystals along the uneven structure. The uneven structure is set to have the above size, and thus it is possible to easily arrange nanocrystals to match a desired shape without a need for setting the supernatant liquid to be a dispersion liquid in which nanocrystal is dispersed with high concentration.

In the method of arranging nanocrystals according to one aspect of the present invention, if the uneven structure is formed by a polymer film which is not dissolved in the nonpolar solvent, it is possible to avoid a situation in which the uneven structure is dissolved and regularity of arrangement is broken in the process of arranging nanocrystals.

In the method of arranging nanocrystals according to one aspect of the present invention, if the third process is further performed once or is repeated plural times on a substrate in which nanocrystals are arranged by the method of arranging nanocrystals in any one of (1) to (8), it is possible to stack nanocrystals so as to be multilayered. That is, a structure (stacked body) in which nanocrystals for the second layer, the third layer, and the like are arranged can be formed in a manner in which nanocrystals are further arranged on a single layer (film) in which nanocrystals are arranged. In a case where voids are provided in a film in which nanocrystals corresponding to the first layer are arranged, a structure in which the voids are buried or a structure in which nanocrystals for the second layer, the third layer, and the like are arranged while burying the voids can be formed.

In the method of arranging nanocrystals in any of (1) to (8), nanocrystals can be two-dimensionally arranged. Thus, it is possible to three-dimensionally bottom the nanocrystal structure up.

The method of producing a nanocrystal structure according to one aspect of the present invention includes a first process of putting barium titanate nanocrystals and/or strontium titanate nanocrystals, and a nonpolar solvent into a container, a second process of collecting a supernatant liquid including the barium titanate nanocrystals and/or the strontium titanate nanocrystals from the container, and a third process of coating a surface of the uneven structure with the supernatant liquid by using a capillary phenomenon, and producing a structure formed by the barium titanate nanocrystals and/or the strontium titanate nanocrystals on the uneven structure. Thus, it is possible to two-dimensionally arrange nanocrystals along the uneven structure and to produce a nanocrystal structure which is three-dimensionally bottomed-up by using the supernatant liquid which is obtained by performing centrifugation of a solution in a state where the nanocrystals are dispersed by the nonpolar solvent without being aggregated.

The method of producing a nanocrystal structure according to one aspect of the present invention employs the third process of immersing the substrate having an uneven structure and pulling the substrate up so as to coat the surface of the uneven structure with the supernatant liquid by using the capillary phenomenon and to arrange nanocrystals on the uneven structure. The substrate has the uneven structure, and thus it is possible to selectively arrange nanocrystals at a recessed portion thereof or to selectively fill the recessed portion with nanocrystals, and to provide anisotropy for a drying rate of a solvent. Thus, it is possible to suppress an occurrence of a crack and the like at a time of drying and contraction. It is possible to produce a nanocrystal structure having a continuous and uniform thickness on the entirety of the substrate.

In the method of producing a nanocrystal structure according to one aspect of the present invention, in the second process, if the supernatant liquid is set to be obtained in a manner in which the supernatant liquid is put into a container and performing centrifugation on the container, it is possible to produce a nanocrystal structure formed by nanocrystals which have a more uniform size.

In the method of producing a nanocrystal structure according to one aspect of the present invention, if the third process is performed once or is repeated plural times on the substrate in which a nanocrystal structure is produced by the method of producing a nanocrystal structure in (10) or (11), it is possible to stack nanocrystal films (layers) so as to be multilayered. That is, nanocrystal films (layers) for the second, the third, and the like are stacked on a single nanocrystal film (layer), and thus it is possible to form a nanocrystal structure which is uniform and continuous. In a case where voids are provided in the first nanocrystal film, the voids can be buried, or nanocrystal films (layers) for the second, the third, and the like can be stacked while burying the voids. Since a chemical composition of a film can be controlled for each layer, a mixed and stacked body (mixed nanocrystal structure) in which a layer of barium titanate, a layer of strontium titanate, and a layer of barium titanate and strontium titanate at a certain composition ratio are mixed at a certain ratio in a certain order can be produced.

In the method of producing a nanocrystal structure according to one aspect of the present invention, a substrate having an uneven structure in which a nanocrystal structure is formed may be immersed into a polar solvent, so as to dissolve the uneven structure. The nanocrystal structure is formed in the uneven structure, and then the uneven structure is removed, and thus it is possible to produce a substrate in which only the nanocrystal structure is formed.

According to the method of manufacturing a nanocrystal structure formation substrate of one aspect of the present invention, the nanocrystal structure is produced on the substrate by the method of producing a nanocrystal structure described in any of (10) to (13). Thus, nanocrystals constituting the nanocrystal structure are arranged well. Since nanocrystals are arranged well, it is possible to effectively show properties of each nanocrystal and a function caused by an interface between the nanocrystals, and to manufacture a nanocrystal structure formation substrate which can be applied to various electronic devices. In the nanocrystal structure configured from nanocrystals, application to an electronic device and the like by using the arrangement of nanocrystals in a plane and arrangement of nanocrystals in a film thickness direction can be made.

In the method of manufacturing a nanocrystal structure formation substrate according to one aspect of the present invention, if the substrate is selected from the group consisting of FTO, ITO, glass, silicon, metal, ceramics, polymer, paper, rubber, and a low heat-resistant base material in accordance with the usage, it is possible to effectively show properties of each nanocrystal and a function caused by an interface between the nanocrystals. Thus, it is possible to manufacture a nanocrystal structure formation substrate which can be applied to various electronic devices.

A nanocrystal film-coated substrate according to one aspect of the present invention includes a substrate and a nanocrystal structure in which barium titanate nanocrystals and/or strontium titanate nanocrystals are arranged on the substrate. Thus, in the nanocrystal structure, nanocrystals are arranged well. Since nanocrystals are arranged well, it is possible to effectively show properties of each nanocrystal and a function caused by an interface between the nanocrystals, and to allow application to various electronic devices.

DESCRIPTION OF EMBODIMENTS

Hereinafter, a method of arranging nanocrystals, a method of producing a nanocrystal structure, a nanocrystal structure formation substrate, and a method of manufacturing a nanocrystal structure formation substrate according to an embodiment to which the present invention is applied will be described in detail with reference to the drawings.

[Synthesis of Barium Titanate Nanocrystals]

Barium titanate nanocrystals can be synthesized as follows.

A barium hydroxide aqueous solution, an aqueous solution of a water-soluble titanium complex, a sodium hydroxide aqueous solution, an amine compound, and organic carboxylic acid are mixed to obtain a solution. If the obtained solution is heated to perform synthesis, barium titanate nanocrystals are obtained.

Synthesis is preferably performed in a state of being pressed by sealing a container, for example. Heating in a state of being pressed is referred to as hydrothermal synthesis.

Figure 1:
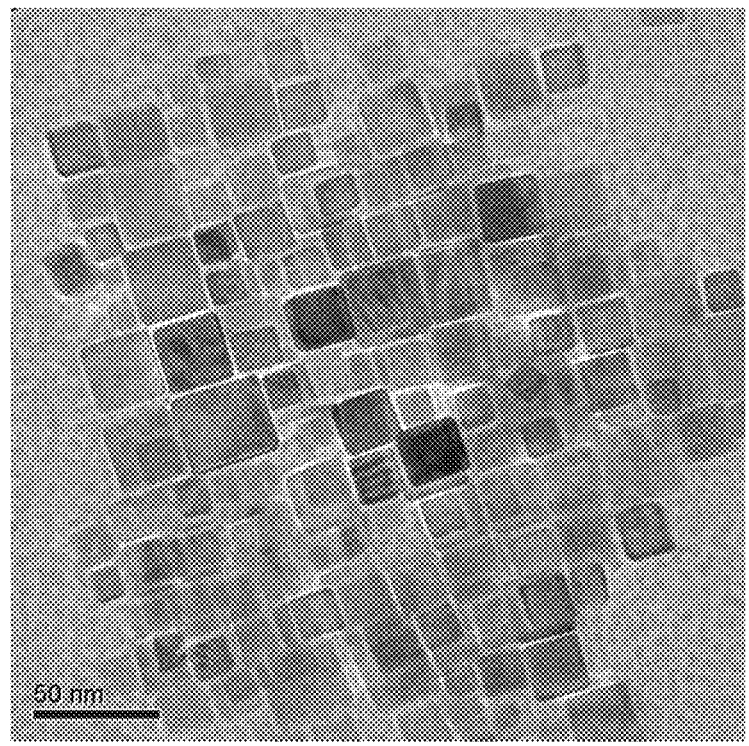
FIG. 1 is a TEM image of barium titanate nanocrystals, which are obtained by hydrothermal synthesis.
Figure 2:
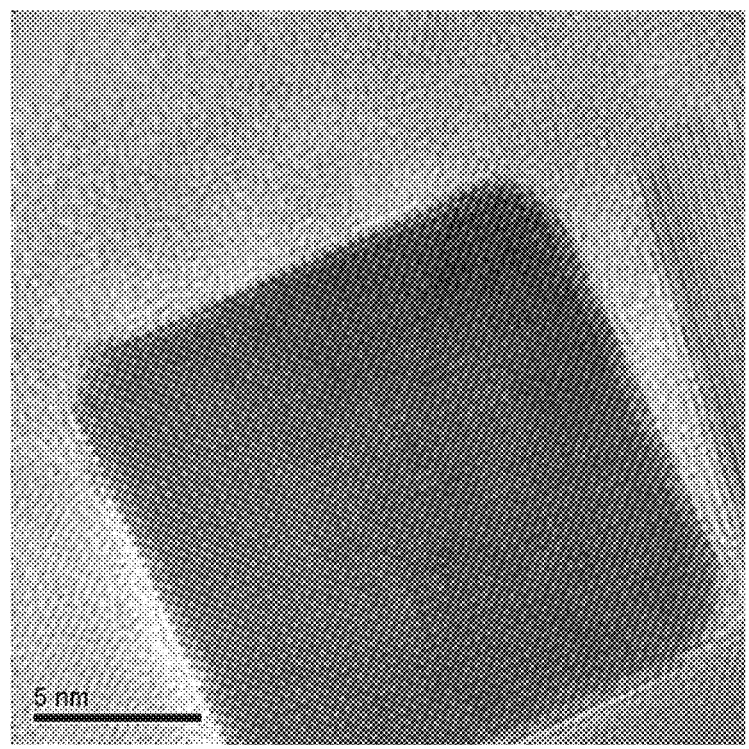
FIG. 2 is a TEM image of barium titanate nanocrystals, which are obtained by hydrothermal synthesis.

Barium titanate nanocrystals shown in TEM images of FIGS. 1 and 2 were synthesized under the following conditions.

24 ml of a 0.05 mol/L (0.05 M) barium hydroxide aqueous solution ($Ba(OH)_2$), 0.72 ml of a TALH (water-soluble titanium complex), 3.8 ml of oleic acid (OLA) (organic carboxylic acid), 1.28 ml of tert-butylamine (amine compound), and 6 ml of a 1 mol/L (1 M) sodium hydroxide (Na(OH)) aqueous solution were put into an autoclave and were mixed. Barium hydroxide aqueous solution and TALH were mixed so as to satisfy Ba:Ti=1:1 and to satisfy Ba:OLA:tert-butylamine=1:8:8. After the sealed autoclave was heated at 200° C. for 72 hours, the autoclave was cooled to room temperature, and thus barium titanate nanocrystals were synthesized.

The sodium hydroxide (Na(OH)) aqueous solution was added as a pH regulator. Ammonia, which is commonly used as a pH regulator in hydrothermal synthesis, is not a sufficiently strong base condition to allow synthesis to easily proceed. This is because a stronger base is not obtained even though ammonia is further added under a condition of pH 14. However, if sodium hydroxide (Na(OH)) is used, a sufficiently strong base condition is achieved, and thus synthesis of barium titanate nanocrystals easily proceeds.

Organic carboxylic acid can be used even though not including a double bond, if the organic carboxylic acid is carboxylic acid having a long carbon chain such as decanoic acid (capric acid) $CH_3(CH_2)_8COOH$.

FIGS. 1 and 2 are TEM images of barium titanate nanocrystals synthesized under the conditions described in the above example.

FIGS. 1 and 2 are obtained by using JEOL-2100 (300 kV) manufactured by JEOL Corporation.

A sample of barium titanate nanocrystals for observing a TEM image was produced in a manner in which a supernatant liquid in an autoclave was dropped onto a TEM grid (substrate) disposed on filter paper, and a solvent in the dropped supernatant liquid was absorbed to the filter paper and removed. The TEM grid is formed of copper coated with carbon (structure in which a mesh is supported by a collodion film).

A lattice-surface gap of a nanocrystal was confirmed from a position of a spot at each point of an electron diffraction spot image in FIG. 2. As a result, spots of 4.04 Å and 2.85 Å corresponding to the (100) plane and the (001) plane of a barium titanate single crystal were obtained. That is, it was confirmed that barium titanate nanocrystals are synthesized by the above-described synthesis method from the TEM images and the electron diffraction spot images in FIGS. 1 and 2.

It was similarly also determined that barium titanate is provided, from the fact that a (100) diffraction line is shown in the vicinity of 22° and the fact that a (200) diffraction line is shown in the vicinity of 44° by an X-ray powder diffraction method.

[Collection of Barium Titanate Nanocrystals]

Then, the strontium titanate nanocrystal-containing solution was moved from the autoclave to a dedicated container, and centrifugation (5300 rpm (first rotation speed), 3 minutes (first rotation period)) was performed on the container. Barium titanate nanocrystals precipitated on the bottom of the container after centrifugation were collected. As a centrifuge, H9RH model manufactured by Kokusan Co., Ltd was used.

[Synthesis of Strontium Titanate Nanocrystals]

Strontium titanate nanocrystals were synthesized by adding a sodium hydroxide (Na(OH)) aqueous solution to the method disclosed in NPL 1.

Specifically, 24 ml of a 0.05 mol/L (0.05 M) strontium hydroxide aqueous solution $(Sr(OH)_2)$, 0.72 ml of a TALH (water-soluble titanium complex), 0.95 ml of oleic acid (OLA) (organic carboxylic acid), 0.28 ml of hydrazine, and 6 ml of a 1 mol/L (1 M) sodium hydroxide (Na(OH)) aqueous solution were put into an autoclave and mixed. The strontium hydroxide aqueous solution and the TALH were mixed to satisfy Sr:Ti=1:1 and to satisfy Sr:OLA:hydrazine=1:2:4. After the sealed autoclave was heated at 200° C. for 72 hours, the autoclave was cooled to room temperature, and thus strontium titanate nanocrystals were synthesized.

The sodium hydroxide (Na(OH)) aqueous solution was added as a pH regulator. As described above, a sufficiently strong base condition to allow synthesis to easily proceed is not obtained by using ammonia, which is commonly used as a pH regulator in hydrothermal synthesis. This is because a stronger base is not obtained even though ammonia is further added under a condition of pH 14. However, if sodium hydroxide (Na(OH)) is used, a sufficiently strong base condition is achieved, and thus synthesis of strontium titanate nanocrystals easily proceeds.

Organic carboxylic acid can be used even though not including a double bond, if the organic carboxylic acid is carboxylic acid having a long carbon chain such as decanoic acid (capric acid) $CH_3(CH_2)_8COOH$.

Figure 3:
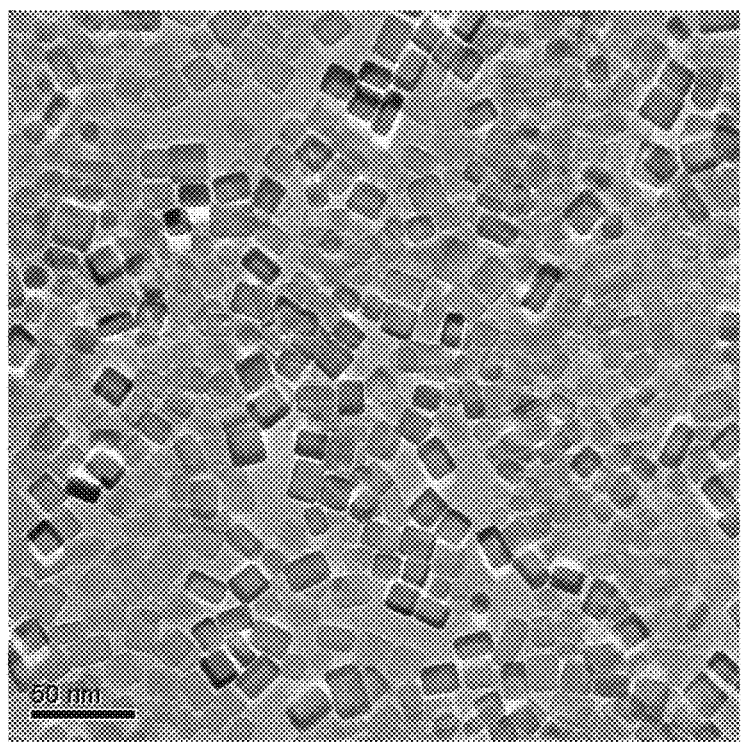
FIG. 3 is a TEM image of strontium titanate nanocrystals, which are obtained by hydrothermal synthesis.

FIG. 3 is a TEM image of strontium titanate nanocrystals synthesized under the conditions described in the above example.

A lattice-surface gap of a nanocrystal was confirmed from a position of a spot at each point of an electron diffraction spot image in FIG. 3. As a result, spots of 3.90 and 2.76 Å corresponding to the (100) plane and the (110) plane of a strontium titanate single crystal were obtained. It was confirmed that strontium titanate nanocrystals are synthesized by the above-described synthesis method from the TEM image and the electron diffraction spot image in FIG. 3.

[Collection of Strontium Titanate Nanocrystals]

Then, the strontium titanate nanocrystal-containing solution was moved from the autoclave to a dedicated container, and centrifugation (5300 rpm (first rotation speed), 3 minutes (first rotation period)) was performed on the container. Strontium titanate nanocrystals precipitated on the bottom of the container after centrifugation were collected. As a centrifuge, H9RH model manufactured by Kokusan Co., Ltd was used.

[Method of Arranging Nanocrystals, Method of Producing Nanocrystal Structure, Method of Manufacturing Nanocrystal Structure Formation Substrate, Nanocrystal Structure Formation Substrate]

The method of arranging nanocrystals or the method of producing a nanocrystal structure according to one aspect of the present invention includes a first process, a second process, and a third process. The first process is a process of putting and mixing barium titanate nanocrystals and/or strontium titanate nanocrystals, and a nonpolar solvent into a container. The second process is a process of collecting a supernatant liquid including the barium titanate nanocrystals and/or the strontium titanate nanocrystals, from a mixture in the container, which is obtained in the first process. The third process is a process of immersing a substrate having an uneven structure into the supernatant liquid obtained in the second process and pulling the substrate up, so as to coat the surface of the uneven structure with the supernatant liquid by using a capillary phenomenon, and to arrange the nanocrystals on the uneven structure.

In the method of manufacturing a nanocrystal structure formation substrate according to one aspect of the present invention, a nanocrystal structure is produced on the substrate by the above-described method of arranging a nanocrystal structure.

The nanocrystal structure formation substrate according to one aspect of the present invention includes a substrate and a nanocrystal structure in which barium titanate nanocrystals and/or strontium titanate nanocrystals are arranged on the substrate.

The barium titanate nanocrystals and the strontium titanate nanocrystals can be obtained by the above-described synthesis and collection method. The barium titanate nanocrystals and the strontium titanate nanocrystals are not limited to nanocrystals obtained by the above-described method, and may use nanocrystals obtained by well-known methods.

When barium titanate nanocrystals and strontium titanate nanocrystals are put into a container along with a nonpolar solvent, it is preferable that a resultant obtained by putting the barium titanate nanocrystals into the nonpolar solvent and a resultant obtained by putting the strontium titanate nanocrystals into the nonpolar solvent not be mixed in the container, but the barium titanate nanocrystals and the strontium titanate nanocrystals be simultaneously put into a container along with the nonpolar solvent, and mixed.

In the former, it is difficult to precisely control a composition ratio of the barium titanate nanocrystals and the strontium titanate nanocrystals. In the latter, the composition ratio is adjusted based on the solid weight, and thus composition control is precise.

Organic carboxylic acid adheres to surfaces of barium titanate nanocrystals obtained by the above synthesis and collection method. Thus, the barium titanate nanocrystals having organic carboxylic acid adhering thereto are easily dispersed in the nonpolar solvent.

As the nonpolar solvent, mesitylene (1,3,5-trimethylbenzene) is preferable. Mesitylene has a high boiling point and low volatility at room temperature. Thus, when the surface of the uneven structure is coated with the supernatant liquid by using the capillary phenomenon, it is possible to pull up the supernatant liquid by a capillary force before the solvent is evaporated from the supernatant liquid. As a result, it is possible to more regularly arrange nanocrystals on the surface of the uneven structure.

Nanocrystals are arranged on the uneven structure by immersing the substrate having an uneven structure therein into the supernatant liquid and pulling up the substrate. When the substrate is pulled up, the surface of the uneven structure is coated with the supernatant liquid by using the capillary phenomenon. It is possible to reliably supply a sufficient amount of supernatant liquid to the recessed portions of the uneven structure by using a dip coat method. Thus, it is possible to arrange nanocrystals at the recessed portion of the uneven structure and to manufacture a nanocrystal structure in which nanocrystals are arranged at higher productivity. It is possible to arrange nanocrystal and to manufacture a nanocrystal structure on the entirety of the substrate.

The substrate has the uneven structure, and thus it is possible to provide anisotropy for a drying rate when the solvent is evaporated from the supernatant liquid applied on the uneven structure. The drying rate has anisotropy, and thus it is possible to suppress the occurrence of a crack by contracting nanocrystals.

The rate of pulling up the substrate is preferably set to be 10 nm/sec to 100 nm/sec and is more preferably 10 nm/sec to 50 nm/sec. If the rate of pulling up the substrate is in the above range, a liquid film (meniscus) generated when the substrate is pulled up becomes uniform, and thus it is possible to continuously arrange nanocrystals while maintaining high uniformity.

The uneven structure has a recessed portion. The recessed portion may have a straight shape, a curved shape, and/or a dot shape. That is, the uneven structure may have a line and space structure in which a straight or curved recessed portion is continuously formed, have a structure in which dot-like recessed portions are scattered, or have a structure in which the above structures are mixed. If the substrate having an uneven structure is immersed into the supernatant liquid and the substrate is pulled up, the liquid film (meniscus) is mainly formed along the recessed portions. The solvent in the liquid film is evaporated, and thus nanocrystals are mainly arranged along the recessed portions. The shortest width and depth of the recessed portions are preferably 0.01 µm to 1 mm. If the shortest width and depth of the recessed portions are too small, the size of the recessed portion is smaller than the size of a nanocrystal, and it is difficult to arrange nanocrystals along the recessed portion. Thus, it is difficult to form a nanocrystal structure. If the shortest width and depth of the recessed portions are too large, when a nanocrystal structure in which nanocrystals are uniformly arranged in the recessed portions is obtained, a large amount of nanocrystals are required. In this case, it is necessary that a liquid in which nanocrystal is dispersed with high concentration be used as the supernatant liquid. However, it is difficult to prepare such a high concentration dispersion liquid.

As the substrate, a substrate which is stable against a solvent (nonpolar solvent and polar solvent) and has no hygroscopicity can be applied. A substrate having a flat surface is preferable. For example, a substrate selected from the group consisting of FTO, ITO, glass, silicon, metal, ceramics, polymer, paper, rubber, and a low heat-resistant base material can be used. Since a substrate which is stable against the solvent is required, using a material which is dissolved in the solvent is not possible.

It is preferable that the uneven structure be formed by a polymer film which is not dissolved in the nonpolar solvent. If the uneven structure is not dissolved in the nonpolar solvent, it is possible to suppress an occurrence of a problem in that the uneven structure for supporting an arrangement direction is dissolved and regularity of arrangement is broken in the process of arranging nanocrystals. As the polymer film which is not dissolved in the nonpolar solvent, for example, polyimide and the like can be used.

It is preferable that the uneven structure be formed by a polymer film which is dissolved in the polar solvent. The uneven structure is formed by such a polymer film, and thus the substrate after nanocrystals are arranged along the uneven structure and a nanocrystal structure is formed can be immersed into the polar solvent so as to dissolve the uneven structure. The uneven structure is removed, and thus it is possible to produce a substrate in which only a nanocrystal structure is formed. As the polar solvent, for example, N-methyl-2-pyrrolidone can be used, and N-methyl-2-pyrrolidone can dissolve polyimide.

The method of producing an uneven structure is not particularly limited. For example, a polymer film is formed on a substrate, and nanoimprint, etching, a photolithography process, and the like can be used. The uneven structure may be formed by a combination thereof.

In a case where barium titanate nanocrystals and/or strontium titanate nanocrystals are obtained in a manner in which synthesis in a solution is performed, and then centrifugation is performed on the solution in the first rotation condition (first rotation speed and first rotation period) and precipitates are collected, the obtained precipitates are dispersed in a solvent again. Then, it is preferable that, in the second process, a rotation condition (second rotation speed and second rotation period) for performing centrifugation be different from the first rotation condition. That is, the rotation condition when the barium titanate nanocrystals and/or strontium titanate nanocrystals are collected is preferably different from the rotation condition when the supernatant liquid is obtained in the second process. The rotation conditions are different from each other, and thus only nanocrystals which are precipitated in the first rotation condition but are not precipitated in the second rotation condition remain in the supernatant liquid. As a result, it is possible to set the size of nanocrystals to be arranged to be more uniform. As the rotation condition, any of the rotation speed or the rotation period may be different.

Specifically, the first rotation speed is generally equal to or higher than 5300 rpm, but the second rotation speed is preferably 3000 to 4500 rpm. The reason is because, regarding the second rotation speed, a difference from the lower limit of the first rotation speed is too small at 4500 rmp, and thus the amount of nanocrystals remaining in the supernatant liquid is too small. It is difficult to precipitate nanocrystals at the second rotation speed of 3000 rmp or lower.

In the method of arranging nanocrystals or in the method of producing a nanocrystal structure, the third process can be further performed once or be repeated plural times. Thus, it is possible to stack nanocrystals so as to be multilayered. In a case where voids are provided in the first nanocrystal film, the voids can be buried, or nanocrystal films (layers) for the second, the third, and the like can be stacked while burying the voids.

As a method of further performing the third process once or repeating the third process plural times, for example, after the third process for the first time is ended, continuously, the third process may be further performed once or be repeated plural times. After the third process for the first time is ended, an arrangement state on the substrate or voids and the like of the film are observed by an electron microscope (SEM) and the like, and then the third process may be further performed once or be repeated plural times.

EXAMPLES

Example 1

Firstly, 0.1 g of powder of barium titanate nanocrystals obtained by the above synthesis and collection method and 20 ml of mesitylene (nonpolar solvent) were put into a container. After an ultrasonic wave was applied to the container for 10 minutes so as to accelerate dispersing of crystals, centrifugation (rotation speed: 5800 rpm) was performed on the container for 5 minutes, and 15 ml of a supernatant liquid including barium titanate nanocrystals was collected. As a centrifuge, H9RH model manufactured by Kokusan Co., Ltd was used.

Simultaneously, a substrate having an uneven structure was prepared. The substrate used silicon and the uneven structure used polyimide. The width of a recessed portion was set to 4 μm and the depth thereof was set to 2.5 μm. Aline and space having an interval (pitch) of 3 μm was produced by pattern etching.

The substrate having the uneven structure was immersed into the collected supernatant liquid and was pulled up at a rate of 25 nm/sec.

Figure 4:
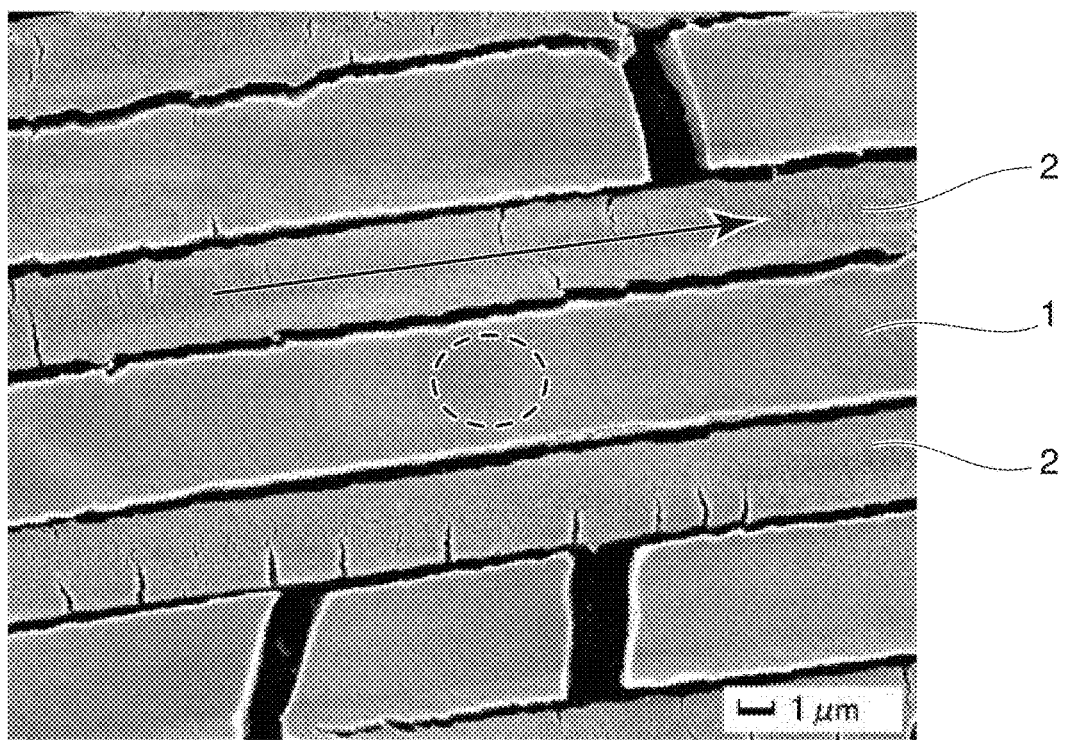
FIG. 4 is an electron microscopic image of a nanocrystal structure formed by barium titanate nanocrystals in Example 1.
Figure 5:
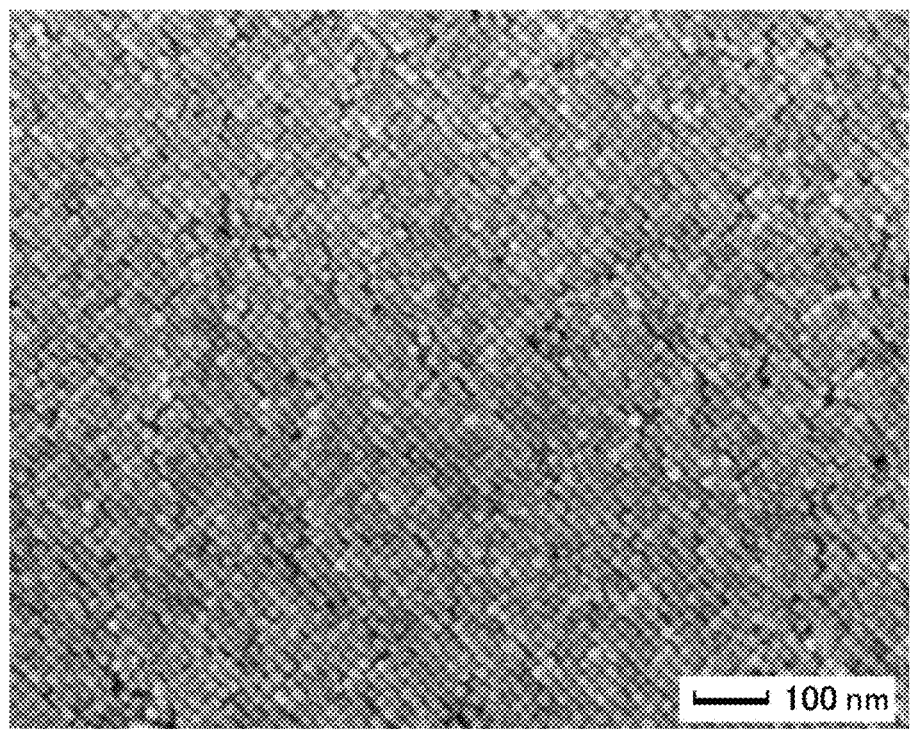
FIG. 5 is an electron microscopic image obtained by capturing an image of a region surrounded by a dotted line in FIG. 4, at a magnification of 100,000.

FIGS. 4 and 5 are electron microscopic (SEM (manufactured by JEOL Corporation, JSM-6335FM, 10 kV)) images illustrating a state where a nanostructure is formed on a substrate.

FIG. 4 is an image obtained by capturing an image at a magnification of 5000. FIG. 5 is an image obtained by capturing an image of a region surrounded by a dotted line in FIG. 4, at a magnification of 100,000. A direction indicated by an arrow in FIG. 4 is a direction of pulling up the substrate. The reference sign of 1 indicates a nanocrystal structure and the reference sign of 2 indicates a protrusion portion of the uneven structure. Each small square illustrated in FIG. 5 indicates a nanocrystal.

As illustrated in FIG. 4, a nanocrystal structure is formed along the recessed portions. As illustrated in FIG. 5, the nanocrystal structure is formed by arranging fine nanocrystals. The nanocrystals in FIG. 5 are significantly uniformly arranged. That is, a nanocrystal structure in which nanocrystals are two-dimensionally arranged along the uneven structure and bottom-up is three-dimensionally performed is produced.

Example 2

Example 2 is different from Example 1 only in that the line and space of the uneven structure are formed at an interval (pitch) of 3 μm by the recessed portion being 4.5 μm in width and 2.3 μm in depth.

Figure 6:
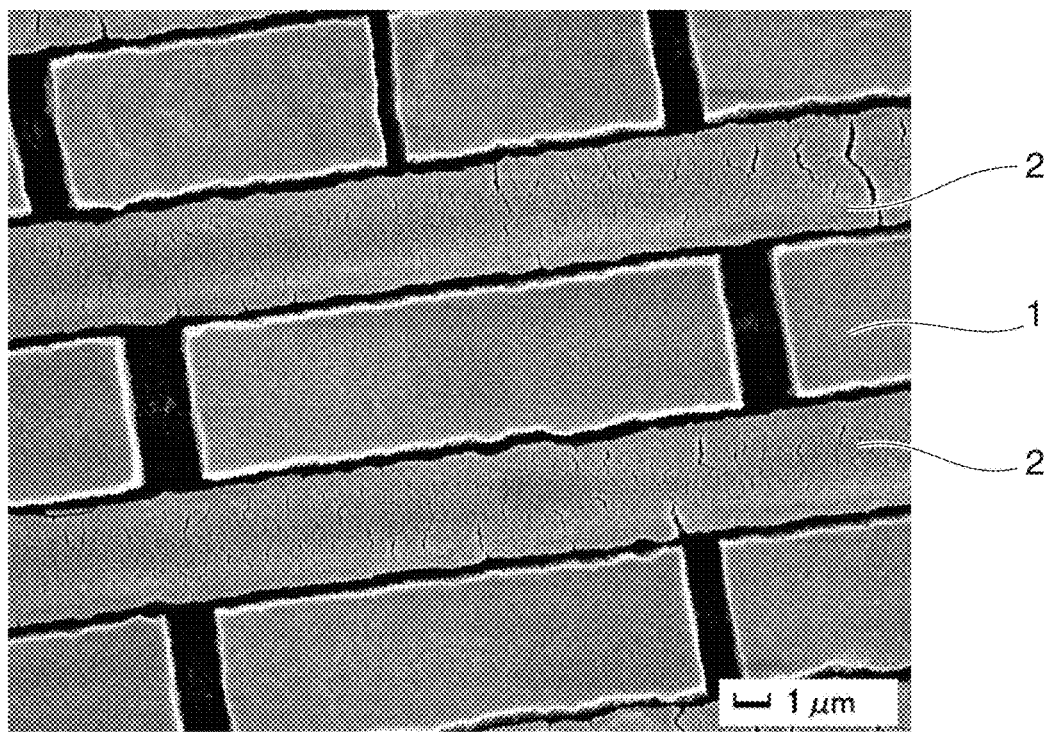
FIG. 6 is an electron microscopic image of a nanocrystal structure formed by barium titanate nanocrystals in Example 2.

FIG. 6 is an electron microscopic image of a nanocrystal structure formed in the condition in Example 2. As illustrated in FIG. 6, even though the shape of the line and space is changed, a similar nanocrystal structure is obtained. The reference signs in FIG. 6 are the same as those in FIG. 5.

Example 3

Figure 7:
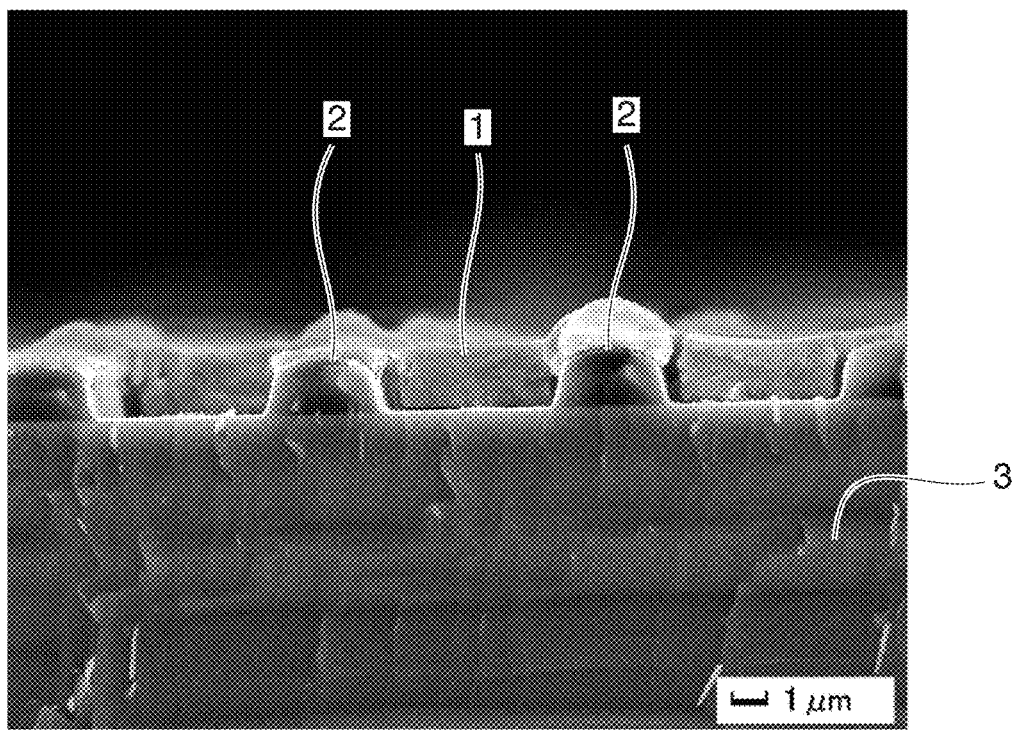
FIG. 7 is an electron microscopic image of a section of a nanocrystal structure formed by barium titanate nanocrystals in Example 3.

Example 3 is different from Example 1 only in that the pulling rate is set to 22 nm/sec. FIG. 7 is an electron microscopic image obtained by capturing an image of a section of a nanocrystal structure formed in the condition in Example 3. In FIG. 7, the reference sign of 1 indicates a nanocrystal structure, the reference sign of 2 indicates a protrusion portion of the uneven structure, and the reference sign of 3 indicates a substrate. As illustrated in FIG. 7, the nanocrystal structure is formed along the uneven structure.

Example 4

Figure 8:
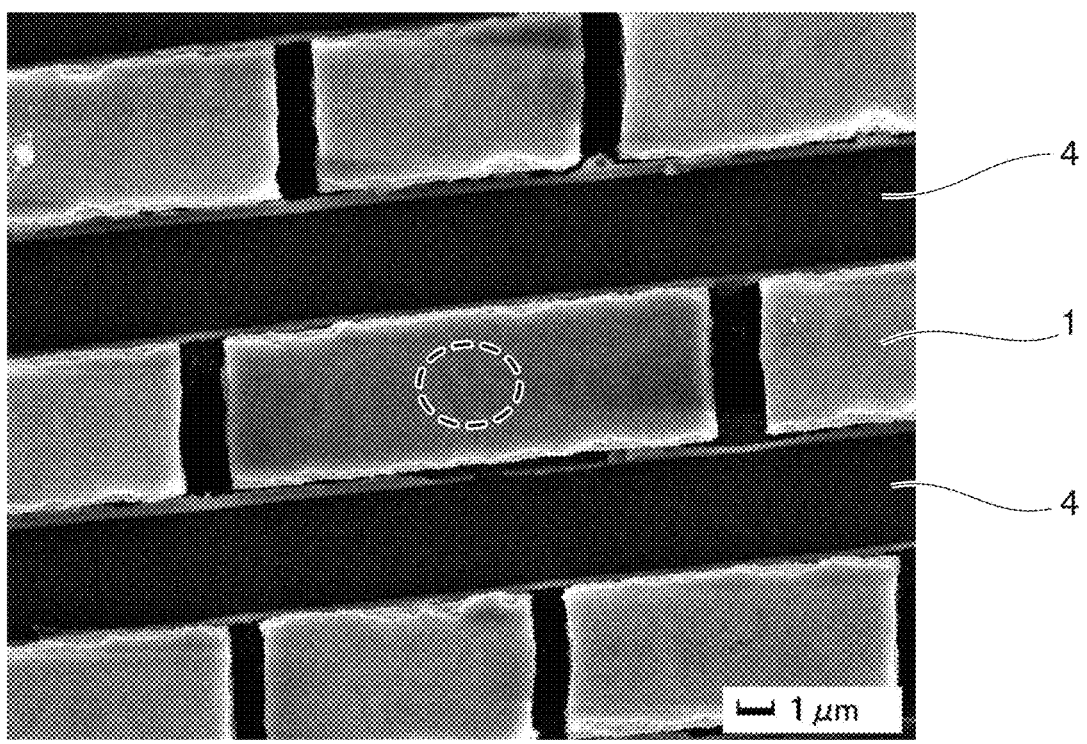
FIG. 8 is an electron microscopic image of Example 4 in which an uneven structure is removed, and only a nanocrystal structure is formed on a substrate.
Figure 9:
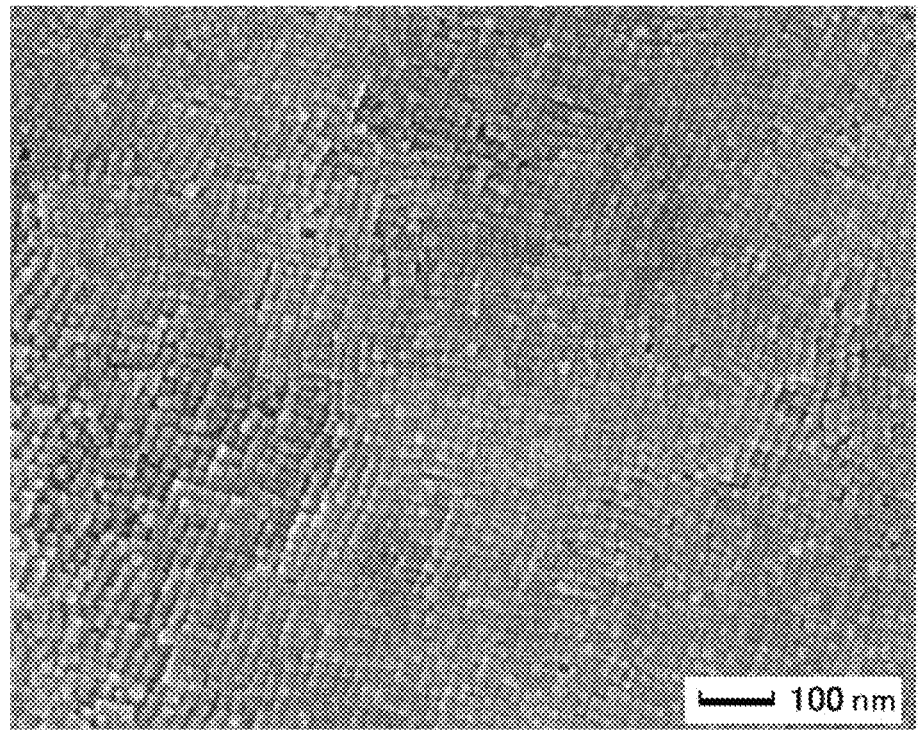
FIG. 9 is an electron microscopic image obtained by capturing an image of a region surrounded by a dotted line in FIG. 8, at a magnification of 100,000.
Figure 10:
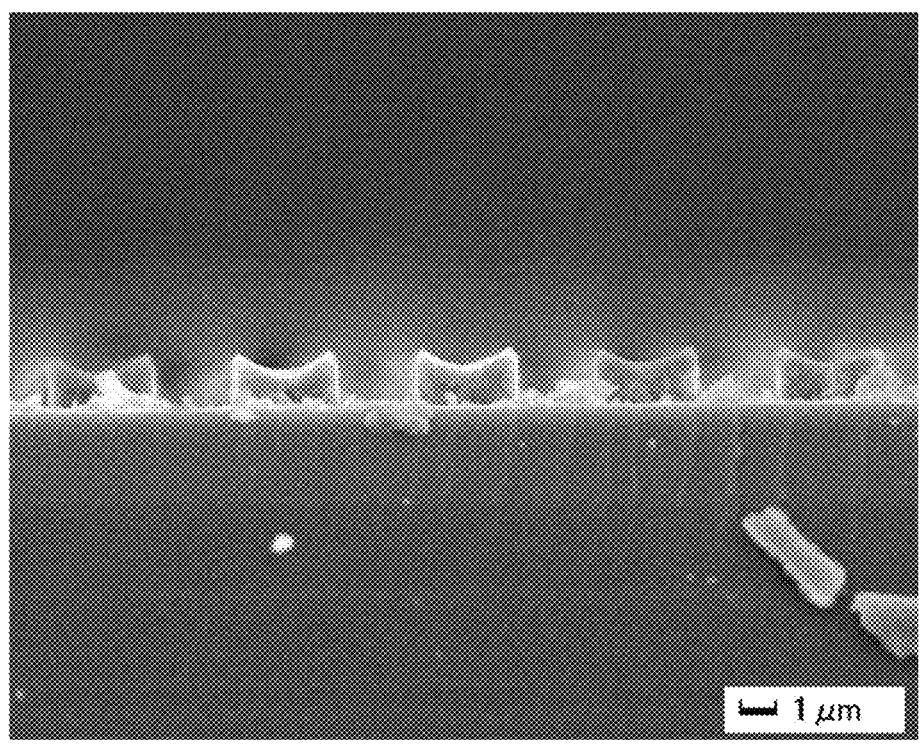
FIG. 10 is an electron microscopic image obtained in a manner in which an image of a section of a nanocrystal structure in Example 4 in which an uneven structure is removed and only a nanocrystal structure is formed on a substrate is captured by an electron microscope.

In Example 4, the nanocrystal structure formation substrate in Example 3 was immersed at 65° C. in N-methyl-2-pyrrolidone for 8.5 days. FIGS. 8 and 9 are electron microscopic images obtained by capturing the surface of a nanocrystal structure formed in the condition in Example 4. FIG. 10 is an electron microscopic image obtained by capturing an image of a section of the nanocrystal structure formed in the condition in Example 4. FIG. 8 is an image obtained by capturing at a magnification of 5000. FIG. 9 is an image obtained by capturing at a magnification of 100,000. FIG. 10 is an image obtained by capturing at a magnification of 5000. In FIG. 8, the reference sign of 1 indicates a nanocrystal structure, and the reference sign of 4 indicates a gap obtained by removing the uneven structure. FIG. 9 is an electron microscopic image of an enlarged region of a dotted line in FIG. 8.

As illustrated in FIGS. 8 and 10, the substrate is immersed into N-methyl-2-pyrrolidone, and thus it is possible to obtain a nanocrystal structure formation substrate in which the uneven structure formed from polyimide is removed and only the nanocrystal structure is formed. As illustrated in FIG. 9, even though the substrate is immersed into N-methyl-2-pyrrolidone, there is no influence on the nanocrystal structure, and the nanocrystal structure is formed by arranging nanocrystals.

Example 5

Figure 11:
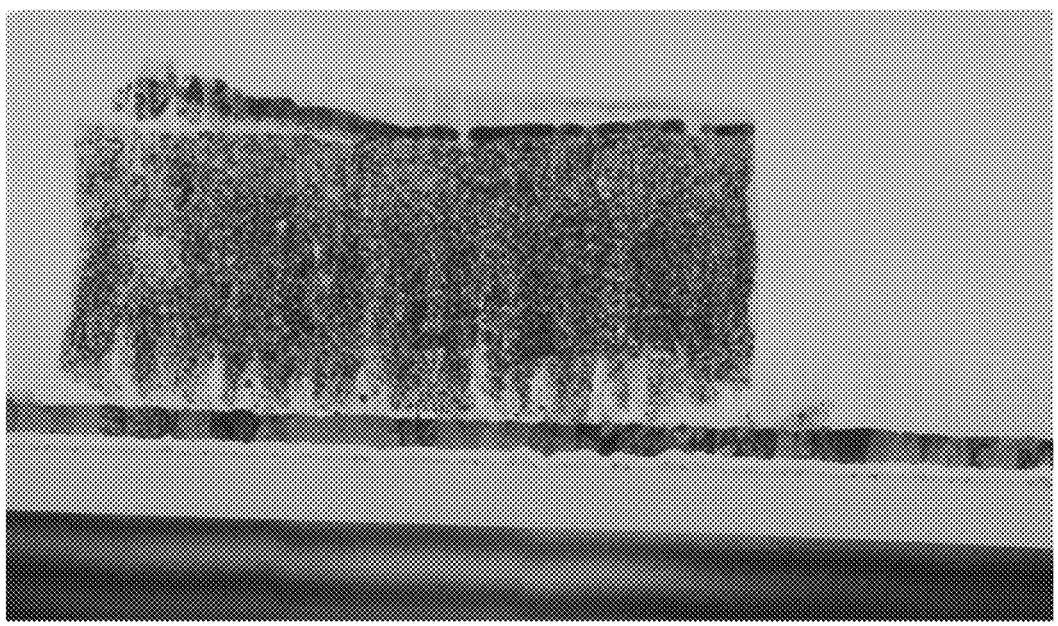
FIG. 11 is a transmission type electron microscopic image obtained by capturing an image of a section of a nanocrystal structure which is formed in a condition in Example 5.
Figure 12:
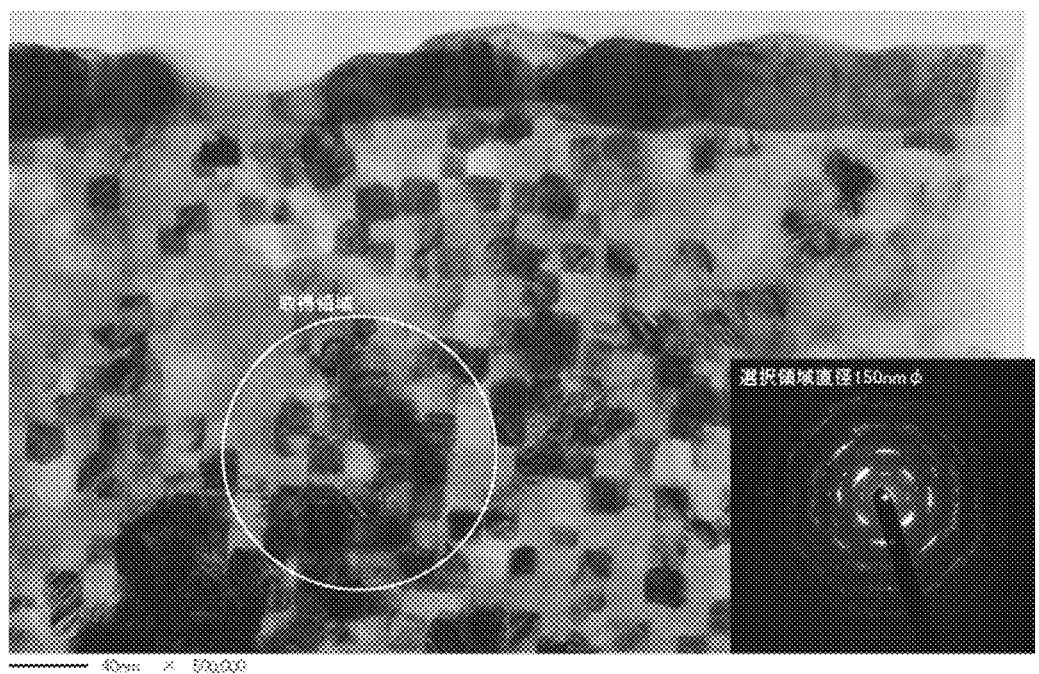
FIG. 12 is a transmission type electron microscopic image obtained by enlarging and capturing an image of a section of a vicinity of an upper electrode in the nanocrystal structure formed in the condition in Example 5.

In Example 5, electron beam evaporation of platinum so as to have a thickness of 100 nm was performed at an upper portion of the nanocrystal structure formation substrate manufactured in the procedures of Example 3 by using a mesh mask (hole diameter of 10 μm) on the substrate in which a polyimide unevenness pattern is formed on silicon coated with platinum. Then, similarly to Example 4, immersion into N-methyl-2-pyrrolidone at 65° C. was performed for 8.5 days. The obtained aggregate was prefired at 400° C. in an oxygen flow for one hour. Then, main firing was performed at 850° C. for one hour. FIGS. 11 and 12 are transmission type electron microscopic images obtained by capturing an image of a section of a nanocrystal structure formed in the condition in Example 5. FIG. 11 is an image obtained by capturing at a magnification of 50,000. FIG. 12 is an image obtained by enlarging the vicinity of an upper electrode and capturing an image of the enlarged vicinity at a magnification of 500,000.

From FIG. 11, it was confirmed that exfoliation of a portion of an electrode was viewed but a capacitor structure of metal/nanocube aggregate/metal (Metal/Insulator/Metal, MIM) could be formed. However, a structure in which many holes are provided in the vicinity of an interface of a lower electrode is formed. This is generated by an etching residue when a polyimide mold is produced. As described above, a very small MIM capacitor which is directly patterned on a substrate can be produced by using this method. As illustrated in FIG. 12, regarding cubes which are arranged, firing at 850° C. causes bonding at an interface, and the interface becomes smooth. In the electron diffraction pattern illustrated in the inserted figures right and left in FIG. 12, it is understood that a spot-like diffraction pattern is obtained and a section having a significantly high orientation is provided. Contrast of light and dark can be confirmed between nanocrystals. This indicates integration having a slight angle or slight distortion. The structure is similar to a nanocrystal-arranged structure in which integration is performed on a substrate which is not subjected to micro processing. The interface structure is considered as a source showing high dielectric characteristics. Thus, it is possible to expect that similar characteristics can be provided.

INDUSTRIAL APPLICABILITY

The method of arranging nanocrystals, the method of producing a nanocrystal film, a nanocrystal film-coated substrate, and the method of manufacturing the nanocrystal film-coated substrate according to one aspect of the present invention can be used in manufacturing an electronic device and the like.

The invention claimed is:

1. A method of arranging nanocrystals, comprising:
   a first process of putting barium titanate nanocrystals and/or strontium titanate nanocrystals, and a nonpolar solvent into a container;
   a second process of collecting a supernatant liquid including the barium titanate nanocrystals and/or the strontium titanate nanocrystals from the container; and
   a third process of immersing a substrate having an uneven structure into the supernatant liquid and pulling the substrate up, so as to coat a surface of a recessed portion of the uneven structure with the supernatant liquid by using a capillary phenomenon, and arrange the nanocrystals along the recessed portions of the uneven structure,
   wherein the uneven structure has a line and space structure on which a straight or curved recessed portion is formed, and/or which has dot-shaped recessed portions, and
   the shortest width and a depth of the recessed portions are 2.3 µm to 1 mm.

2. The method of arranging nanocrystals according to claim 1,
   wherein, in the second process, the supernatant liquid is obtained by performing centrifugation on the container.

3. The method of arranging nanocrystals according to claim 2,
   wherein the barium titanate nanocrystals and/or strontium titanate nanocrystals are obtained in a manner in which synthesis is performed in a solution, and then the solution is subjected to centrifugation in a first rotation condition and precipitates are collected, and
   a rotation condition when centrifugation is performed on the container in the second process is different from the first rotation condition.

4. The method of arranging nanocrystals according to claim 1,
   wherein organic carboxylic acid adheres to surfaces of the barium titanate nanocrystals and/or the strontium titanate nanocrystals before being put into the container.

5. The method of arranging nanocrystals according to claim 1,
   wherein the nonpolar solvent is mesitylene (1,3,5-trimethylbenzene).

6. The method of arranging nanocrystals according to claim 1,
   wherein a rate of pulling up the substrate is 10 nm/sec to 100 nm/sec.

7. The method of arranging nanocrystals according to claim 1,
   wherein the uneven structure is formed by a polymer film which is not dissolved in the nonpolar solvent.

8. A method of arranging nanocrystals, comprising:
   further performing the third process once or repeating the third process plural times on a substrate having the uneven structure in which nanocrystals are arranged by the method of arranging nanocrystals according to claim 1.

9. The method of arranging nanocrystals according to claim 1,
   wherein the substrate is selected from the group consisting of FTO, ITO, glass, silicon, metal, ceramics, polymer, paper, rubber, and a low heat-resistant base material, and wherein the uneven structure is formed from polyimide.

* * * * *